(12) United States Patent
Uchiyama (10) Patent No.: US 7,932,142 B2
(45) Date of Patent: Apr. 26, 2011

(54) TRANSISTOR IN A WIRING INTERLAYER INSULATING FILM

(75) Inventor: Hiroyuki Uchiyama, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 41 days.

(21) Appl. No.: 12/289,372

(22) Filed: Oct. 27, 2008

(65) Prior Publication Data

US 2009/0121283 A1    May 14, 2009

(30) Foreign Application Priority Data

Nov. 14, 2007   (JP) ................................. 2007-295770

(51) Int. Cl.
  *H01L 21/8238* (2006.01)
(52) U.S. Cl. ........................................ 438/206; 257/330
(58) Field of Classification Search ................... 438/206; 257/330

See application file for complete search history.

(56) References Cited

U.S. PATENT DOCUMENTS

| | | | | |
|---|---|---|---|---|
| 6,624,032 B2 * | 9/2003 | Alavi et al. | .................... | 438/283 |
| 6,770,534 B2 * | 8/2004 | Cho et al. | ....................... | 438/268 |
| 2002/0139973 A1 * | 10/2002 | Nakazato et al. | ................ | 257/28 |
| 2002/0170484 A1 * | 11/2002 | Katamine et al. | .................. | 117/4 |
| 2003/0024905 A1 * | 2/2003 | Tanaka | ........................ | 219/121.6 |
| 2003/0092277 A1 * | 5/2003 | Kondo | ........................... | 438/710 |
| 2003/0194856 A1 * | 10/2003 | Yen et al. | ....................... | 438/618 |
| 2008/0012066 A1 * | 1/2008 | Lin | ................................. | 257/329 |

FOREIGN PATENT DOCUMENTS

| | | |
|---|---|---|
| JP | 58-063173 | 4/1983 |
| JP | 07-297406 | 11/1995 |
| JP | 2005-286165 A | 10/2005 |
| JP | 2005-294571 A | 10/2005 |

* cited by examiner

*Primary Examiner* — Thao X Le
*Assistant Examiner* — Geoffrey Ida
(74) *Attorney, Agent, or Firm* — Foley & Lardner LLP (57) ABSTRACT

A semiconductor device includes a substrate; a first insulating layer provided on the substrate; a conductive layer buried in the first insulating layer; a semiconductor pillar including a lower diffusion layer provided immediately above the conductive layer, the lower diffusion layer being electrically connected to the conductive layer, a semiconductor layer on the lower diffusion layer, and an upper diffusion layer on the semiconductor layer; a gate insulating film provided on a peripheral side surface of the semiconductor layer; a gate electrode provided on the gate insulating film; and a second insulating layer provided such that the gate electrode and a circumference of the semiconductor pillar are buried in the second insulating layer.

16 Claims, 9 Drawing Sheets

TRANSISTOR IN A WIRING INTERLAYER INSULATING FILM

BACKGROUND OF THE INVENTION

1. Field of the Invention

The present invention relates to a semiconductor device and a fabrication method of the same.

2. Description of Related Art

Various MOS transistors have been proposed for high performance MOS transistors, but the current mainstream is a so-called planar transistor including a gate electrode provided on a silicon substrate through a gate insulating film, a source diffusion layer and a drain diffusion layer provided on both sides thereof.

When such a planar transistor is used, an integration density thereof is restricted by the substrate area and the occupied area for element isolation. In addition, an increase in the packaging density of transistors causes an increase in the wiring complexity and the occupied area for wiring, and thus a further increase in the packaging density becomes more difficult. Moreover, for cost reduction, an increase in the substrate diameter is attempted to increase the number of chips to be obtained by one substrate, but further increase in the diameter of a silicon substrate becomes more difficult.

Further, the silicon substrate is of a circular planar shape in the nature of the fabrication method, which has a problem in that when an ordinary rectangular semiconductor chip is fabricated, the circular peripheral edge of the substrate remains unused.

In contrast to such a planar transistor, there is proposed a so-called vertical transistor without a need to use a silicon substrate. For example, Japanese Patent Laid-Open No. 7-297406 discloses a vertical thin film semiconductor device in which a drain electrode, a silicon layer, and a source electrode are laminated in a direction perpendicular to a substrate surface, wherein the drain electrode is formed in contact with the substrate surface, and the drain electrode occupies a wider area than the source electrode.

SUMMARY

In one embodiment, there is provided a semiconductor device including:
 a substrate;
 a first insulating layer provided on the substrate;
 a conductive layer buried in the first insulating layer;
 a semiconductor pillar including a lower diffusion layer provided immediately above the conductive layer, the lower diffusion layer being electrically connected to the conductive layer, a semiconductor layer on the lower diffusion layer, and an upper diffusion layer on the semiconductor layer;
 a gate insulating film provided on a peripheral side surface of the semiconductor layer;
 a gate electrode provided on the gate insulating film; and
 a second insulating layer provided such that the gate electrode and a circumference of the semiconductor pillar are buried in the second insulating layer.

In another embodiment, there is provided the semiconductor device, wherein the gate electrode is provided on the gate insulating film such that the gate electrode surrounds a circumference of the semiconductor layer.

In another embodiment, there is provided any one of the semiconductor devices, wherein the lower diffusion layer is made of an impurity containing single crystal silicon layer on a polysilicon layer.

In another embodiment, there is provided any one of the semiconductor devices, further including a silicon nitride film covering an upper surface of the first insulating layer, wherein the gate electrode and the second insulating layer are provided on the silicon nitride film.

In another embodiment, there is provided any one of the semiconductor devices, wherein the substrate is an insulating substrate.

In another embodiment, there is provided any one of the semiconductor devices, wherein the gate electrode includes an extension portion extending in a substrate plane direction; and
 the semiconductor device further includes:
  a third insulating layer provided on the second insulating layer;
  a first conductive plug passing through the third insulating layer, the first conductive plug being connected to the upper diffusion layer;
  a second conductive plug passing through the third insulating layer and the second insulating layer, the second conductive plug being connected to the extension portion of the gate electrode;
  a conductive layer provided on the third insulating layer, the conductive layer being connected to the first conductive plug; and
  a conductive layer provided on the third insulating layer, the conductive layer being connected to the second conductive plug.

In another embodiment, there is provided any one of the semiconductor devices further including:
 a third insulating layer provided on the second insulating layer;
 a fourth insulating layer provided on the third insulating layer;
 a conductive layer buried in the fourth insulating layer;
 a semiconductor pillar including a lower diffusion layer provided immediately above the conductive layer, the lower diffusion layer being electrically connected to the conductive layer, a semiconductor layer on the lower diffusion layer, and an upper diffusion layer on the semiconductor layer;
 a gate insulating film provided on a peripheral side surface of the semiconductor layer;
 a gate electrode provided on the gate insulating film; and
 a fifth insulating layer provided such that the gate electrode and a circumference of the semiconductor pillar are buried in the fifth insulating layer.

In another embodiment, there is provided a method of fabricating a semiconductor device including:
 forming a first insulating layer on a substrate such that a conductive layer is buried in the first insulating layer;
 forming a sacrificial layer on the first insulating layer;
 forming a hole reaching the conductive layer in the sacrificial layer;
 forming a polysilicon film on a surface containing the inside of the hole;
 forming a mask film such that the hole is filled with the mask film;
 removing the mask film such that a part of the mask film remains in a bottom of the hole;
 removing the polysilicon film using the remaining part of the mask film as a mask to leave a part of the polysilicon film on the hole bottom;
 forming a first single crystal silicon layer by single crystallizing at least an upper layer portion of the remaining polysilicon film part after the remaining mask film part is removed;

forming a lower diffusion layer by injecting an impurity into the first single crystal silicon layer;

forming a second single crystal silicon layer on the lower diffusion layer inside the hole;

forming an upper diffusion layer by injecting an impurity into a surface layer portion of the second single crystal silicon layer;

exposing a semiconductor pillar including the lower diffusion layer formed inside the hole, the semiconductor layer on the lower diffusion layer, and the upper diffusion layer on the semiconductor layer by removing the sacrificial layer;

forming a gate insulating film on the peripheral side surface of the semiconductor layer;

forming a gate electrode on the gate insulating film; and forming a second insulating layer on the gate electrode and the semiconductor pillar.

In another embodiment, there is provided the method of fabricating a semiconductor device, further including forming a etching protection film on the first insulating layer before forming the sacrificial layer, wherein the sacrificial layer is removed by etching using the etching protection film for protecting the first insulating layer.

In another embodiment, there is provided any one of the methods of fabricating a semiconductor device, further including injecting a conductive type impurity opposite to a conductive type of the impurity of the lower diffusion layer into the second single crystal silicon layer, wherein the upper diffusion layer is formed by injecting the same conductive type impurity as the conductive type of the impurity of the lower diffusion layer.

In another embodiment, there is provided any one of the methods of fabricating a semiconductor device, further including:

forming a etching protection film such that the hole is filled with the etching protection film, after forming the upper diffusion layer in the hole;

removing the etching protection film such that a part of the etching protection film remains in the hole;

forming an impurity containing polysilicon film over the semiconductor pillar, after forming the gate insulating film;

forming a side wall covering a peripheral side surface of the semiconductor pillar by performing an etch back using a remaining part of the etching protection film for protecting the semiconductor pillar;

forming a conductive film on the side wall; and forming a conductive film pattern by patterning the conductive film;

wherein the gate electrode comprises the side wall and the conductive film pattern.

The present invention can provide a semiconductor device including a field-effect transistor capable of being formed with a high integration density, and the fabrication method of the same.

BRIEF DESCRIPTION OF THE DRAWINGS

The features and advantages of the present invention will be more apparent from the following description of certain preferred embodiments taken in conjunction with the accompanying drawings, in which.

DETAILED DESCRIPTION OF THE PREFERRED EMBODIMENTS

Since a conventional MOS transistor, which is provided on a flat surface of a substrate, is restricted by the substrate area, the transistor is difficult to be formed thereon in highly density. In recent years, as the process temperature is lowered with a trend of a metalized gate and a shallowed diffusion layer, the difference between the transistor forming process and the wiring forming process is reduced. In view of this, the present inventor has made zealous studies and has found a transistor structure which can be formed not on a substrate surface but in a wiring interlayer insulating film.

The present invention can be effectively applied to a semiconductor device provided with an MIS field effect transistor (hereinafter referred to as a "transistor").

The transistor in accordance with an exemplary embodiment includes a semiconductor pillar including a lower diffusion layer electrically connected to a conductive layer buried in an insulating layer, the lower diffusion layer being provided immediately thereabove, a semiconductor layer on the lower diffusion layer, and an upper diffusion layer on the semiconductor layer; a gate insulating film provided on a peripheral side surface of the semiconductor layer; and a gate electrode provided on the gate insulating film. The gate electrode and the semiconductor pillar are buried in the insulating layer.

The present exemplary embodiment can form a plurality of transistors in a plurality of insulating layers between wiring layers respectively, and thus can increase the number of transistors per unit area.

Moreover, according to the present exemplary embodiment, since the transistor components such as a source, a channel forming region, and a drain are laminated in a direction perpendicular to the substrate surface, the occupied area can be reduced and the number of transistors formed per unit area can be increased in comparison with the conventional planar transistor. Further, a perfect depletion type transistor can be easily formed.

Moreover, according to the present exemplary embodiment, since a transistor can be formed between wiring layers, an inexpensive insulating substrate can be used in stead of a relatively expensive semiconductor single crystal substrate, thereby reducing the cost. Moreover, for example, when a quartz substrate is used, the substrate can be of 1 m or larger size and can be of a rectangular shape, thereby increasing the number of chips obtained and increasing the use efficiency of the entire substrate.

Moreover, according to the present exemplary embodiment, since transistors are separated by an interlayer insulating film, a conventional element isolation process is not required, thereby reducing the cost.

Moreover, according to the present exemplary embodiment, since the gate length control can be performed by the film thickness control based on a film forming technique in stead of a control based on a conventional lithographic technique and etching technique, the gate length controllability can be increased.

Figure 1:
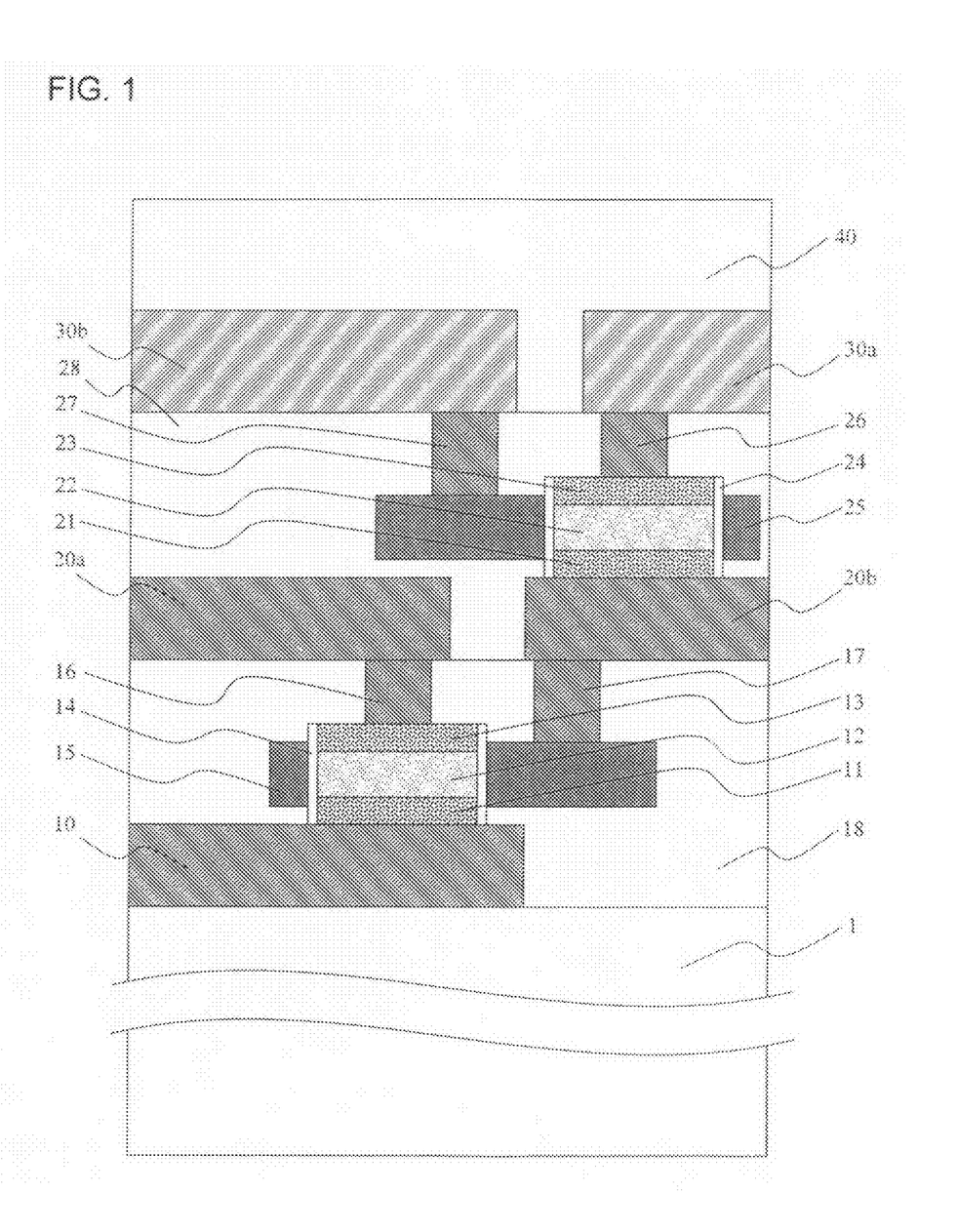
FIG. 1 is a sectional view illustrating a schematic structure of an exemplary embodiment of a semiconductor device in accordance with the present invention.

FIG. 1 illustrates a schematic sectional structure of an exemplary embodiment, in which two MOS transistors are respectively formed in two layers sandwiched by wiring layers.

For example, a quartz substrate can be used as a substrate 1 without undue restriction as long as the substrate has enough flatness and thermal resistance.

On a surface of the substrate 1, there is formed a wiring layer 10 with enough thermal resistance; and on the wiring layer 10, there is formed a semiconductor pillar with a structure in which a lower diffusion layer (source) 11, a semiconductor layer (channel region) 12, and an upper diffusion layer (drain) 13 are laminated in the height direction (direction perpendicular to the substrate surface). In addition, a gate oxide film 14 and a gate electrode 15 are formed so as to surround the semiconductor pillar; and thus a MOS transistor (hereinafter referred to as a "first transistor") is configured in an interlayer insulating film 18.

The upper diffusion layer 13 of the semiconductor pillar of the first transistor is connected to a wiring layer 20a on the interlayer insulating film 18 through a contact plug 16; and the gate electrode 15 is connected to the wiring layer 20b through a contact plug 17. It should be noted that a via plug (not shown) for connecting the lower side wiring layer 10 to the upper side wiring layer is formed as needed.

On the wiring layer 20b, there is provided a MOS transistor (hereinafter referred to as a "second transistor") with the same structure as that of the first transistor located thereunder. There is formed a semiconductor pillar with a structure in which a lower diffusion layer (source) 21, and a semiconductor layer (channel region) 22, and an upper diffusion layer (drain) 23 are laminated. A gate oxide film 24 and a gate electrode 25 are formed so as to surround the semiconductor pillar; and thus the second transistor is configured in an interlayer insulating film 28.

The upper diffusion layer 23 of the semiconductor pillar of the second transistor is connected to a wiring layer 30a on the interlayer insulating film 28 through a contact plug 26; and the gate electrode 25 is connected to a wiring layer 30b through a contact plug 27. It should be noted that a via plug (not shown) for connecting the lower side wiring layer 20b to the upper side wiring layer is formed as needed.

On the wiring layers 30a and 30b, there is formed an insulating protection film 40. It should be noted that above the wiring layers and the insulating protection film, there may be formed another MOS transistor and a wiring layer as needed.

Figure 2:
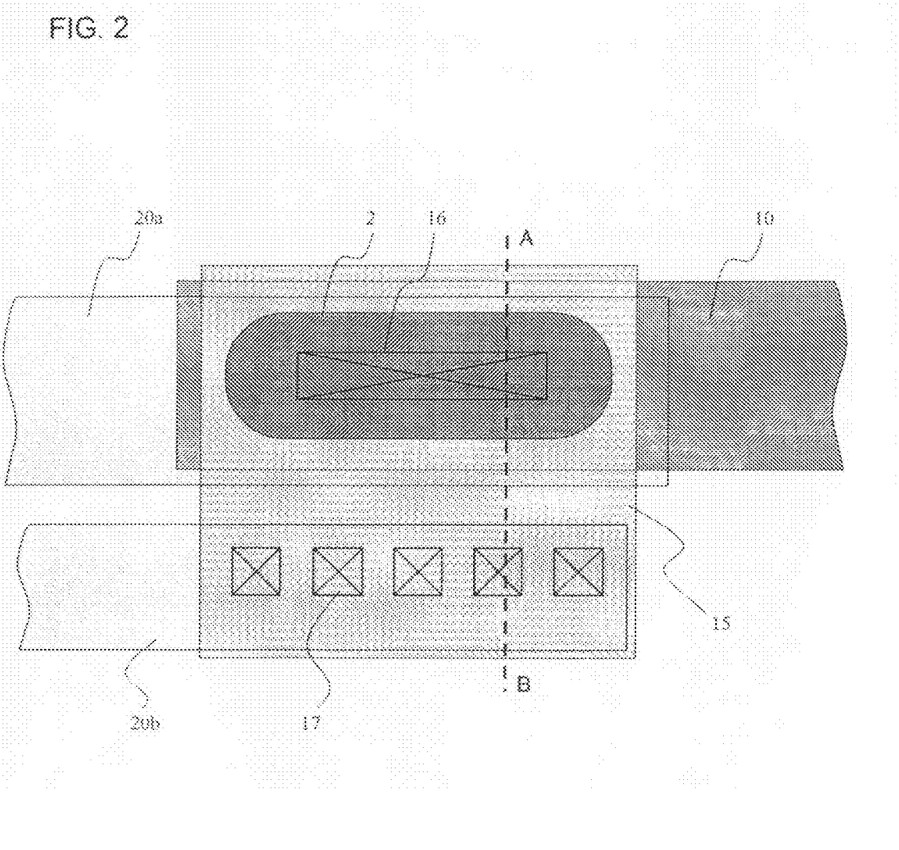
FIG. 2 is a plan view of one MOS transistor in the exemplary embodiment illustrated in FIG. 1.

FIG. 2 illustrates a basic plan layout view of one MOS transistor in the present exemplary embodiment.

The semiconductor pillar (laminated layers of the source, the channel region, and the drain) 2 forming the MOS transistor has a long pattern in the lateral direction in FIG. 2. The short side length (vertical width) is set to, for example, 100 nm or less so as to completely deplete the channel region by an electric field applied from the gate electrode 15 surrounding the circumference thereof. The long side length (lateral width) is set to a length required and enough to flow current necessary for circuit operation.

The semiconductor pillar 2 is provided on the wiring layer 10 such that the lower diffusion layer (source) 11 is in contact with the wiring layer 10. On the semiconductor pillar 2, there is provided the contact plug 16 so as to connect the upper diffusion layer (drain) 13 to the wiring layer 20a.

The gate electrode 15 is extended in one of the vertical direction in the figure (direction perpendicular to the extending direction of the semiconductor pillar). On the extending region adjacent to the semiconductor pillar 2, there is provided the contact plug 17 so as to connect the gate electrode 15 to the wiring layer 20b. The extending direction of the gate electrode and the shape and the area of the extending region can be set appropriately, and is not limited to this figure.

Figure 3A:
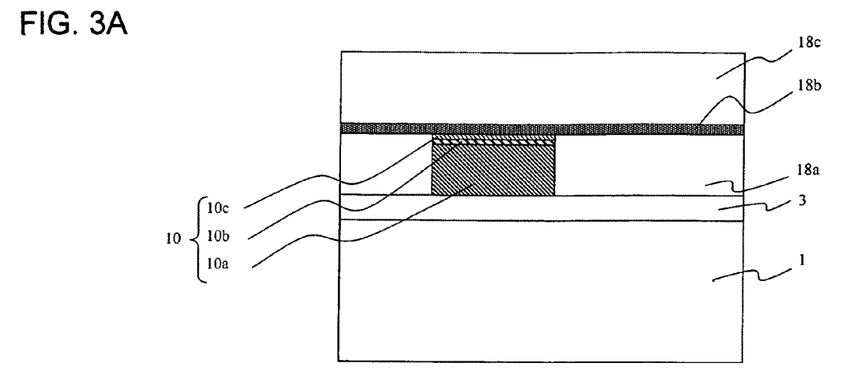
FIG. 3A is a sectional view illustrating a fabrication step for explaining an exemplary embodiment of a fabrication method of the semiconductor device in accordance with the present invention.

Hereinafter, an exemplary embodiment of the fabrication method of the semiconductor device in accordance with the present invention will be described with reference to FIGS. 3A to 3S. FIGS. 3A to 3S illustrate sectional structures of the individual steps corresponding to a section along the A-B line in FIG. 2.

As shown in FIG. 3A, the insulating film 3 made of a silicon oxide film or the like is formed on the quartz substrate 1 as needed, and then, the wiring layer 10 is formed. The wiring layer 10 can be formed, for example, by laminating a tungsten film 10a, a titanium nitride film 10b, and a titanium film 10c in that order, and patterning the films through a general method.

Next, a silicon oxide film 18a is formed so as to bury the wiring layer. The silicon oxide film 18a is planarized by the chemical mechanical polishing (CMP) or the like and the wiring layer 10 is exposed. Then, a silicon nitride film 18b and a silicon oxide film (sacrificial oxide film) 18c are formed. The total size of the film thickness of the silicon nitride film 18b and the film thickness of the silicon oxide film 18c determines the gate length of a transistor to be formed later. In order to give priority to a performance such as a current drive capability, the gate length needs to be as short as possible. In this case, the total size can be set to, for example, 80 nm. In order to give priority to a stability of the characteristics, the gate length needs to be long. In this case, the total size can be set to, for example, 200 nm. When the total size of the film thickness is set in this manner, the silicon nitride film 18b is set to a required minimum thickness (e.g., 10 nm) enough to withstand a subsequent hydrofluoric acid etching.

Figure 3B:
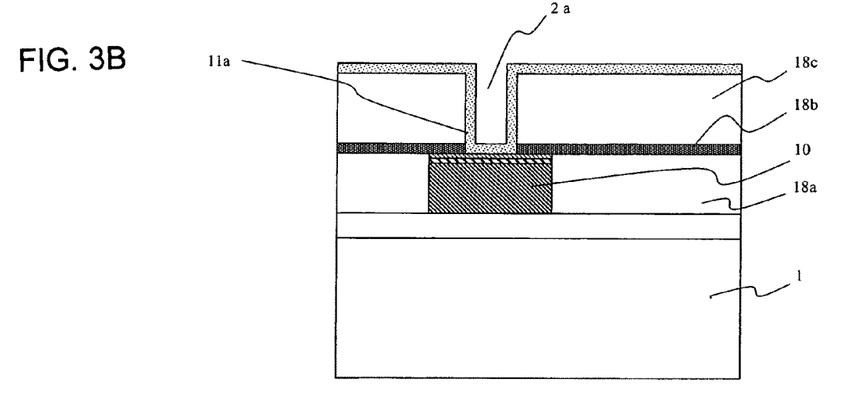
FIG. 3B is a sectional view illustrating a fabrication step following the step illustrated in FIG. 3A.

As shown in FIG. 3B, a hole 2a in which the semiconductor pillar 2 will be formed later is formed so as to expose the wiring layer 10 in the bottom thereof using the lithographic technique and the dry etching technique. Next, a polysilicon film 11a is formed on the entire surface containing the inside of the hole by the CVD method. The film thickness of the polysilicon film 11a is set to a thickness (e.g., 15 nm) not to bury the hole 2a.

Figure 3C:
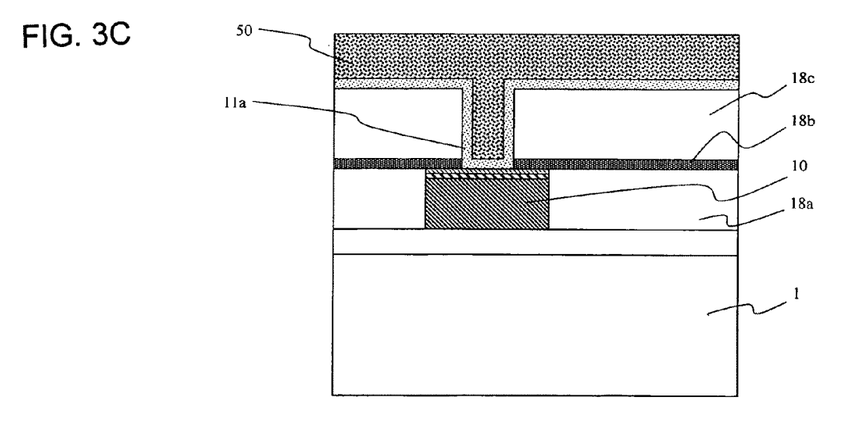
FIG. 3C is a sectional view illustrating a fabrication step following the step illustrated in FIG. 3B.

Next, as shown in FIG. 3C, a resist film 50 is formed so as to bury the entire hole 2a.

Figure 3D:
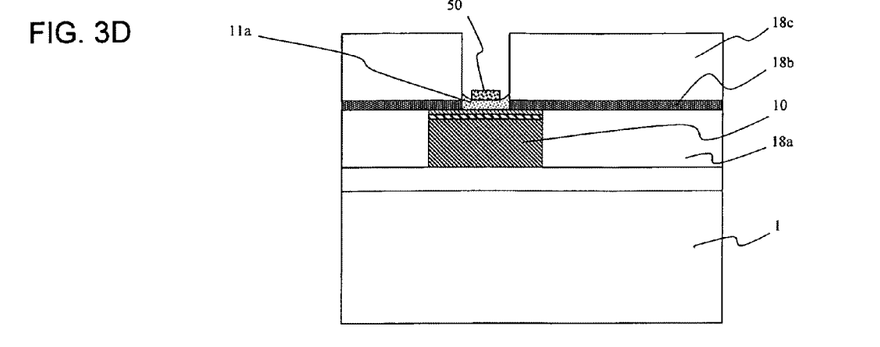
FIG. 3D is a sectional view illustrating a fabrication step following the step illustrated in FIG. 3C.

Next, the resist film 50 is removed such that a part of the resist film remains in the bottom of the hole 2a. Then, as shown in FIG. 3D, the remaining resist film is used as a mask and the polysilicon film 11a is removed, for example, by the isotropic dry etching such that the polysilicon film 11a remains only in the bottom of the hole. The examples of the method of leaving a part of the resist film 50 in the hole bottom include a method of removing the resist up to a predetermined depth in the hole by controlling the amount of light exposure using a positive resist; and a method of leaving a predetermined thickness of resist film in the hole by controlling the amount of etching through etch back by an asher process using an O2/CF4 gas or the like.

Figure 3E:
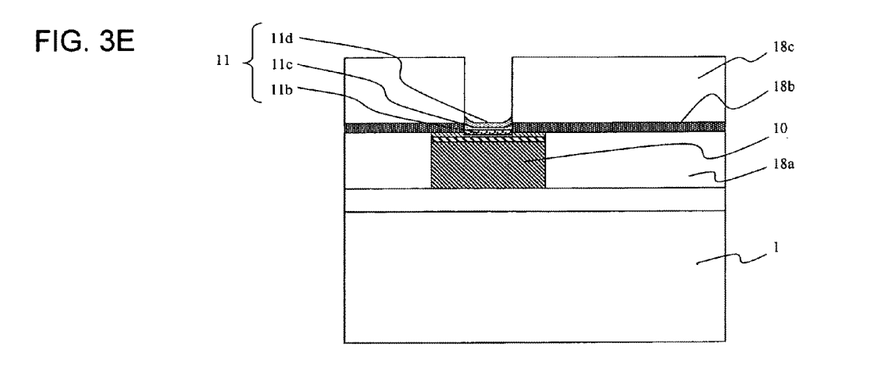
FIG. 3E is a sectional view illustrating a fabrication step following the step illustrated in FIG. 3D.

Next, the remaining resist film 50 is removed, and then, the polysilicon film surface is locally single crystallized using laser annealing or the like. Then, for an n-channel transistor, arsenic or phosphorus is ion-implanted as an n-type impurity; and for a p-channel transistor, boron is ion-implanted as a p-type impurity, and then, heat treatment is performed. As shown in FIG. 3E, the above process forms a single crystal silicon diffusion layer 11d, a polysilicon diffusion layer 11c, and a titanium silicide layer 11b formed by a reaction between polysilicon and underlayer Ti. With the formation, the surface crystallinity is recovered.

Figure 3F:
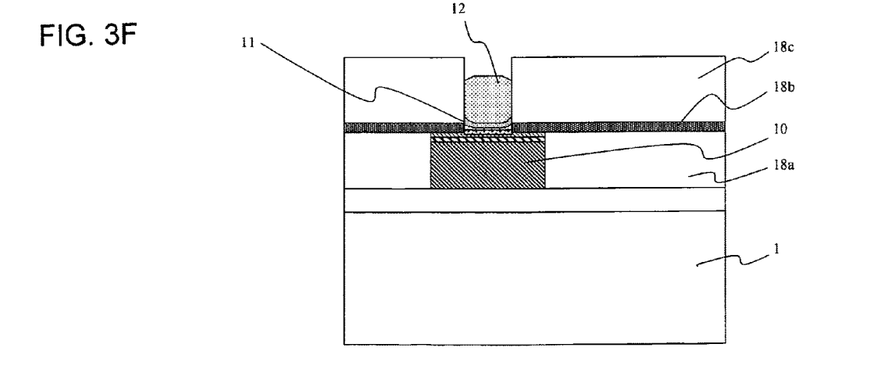
FIG. 3F is a sectional view illustrating a fabrication step following the step illustrated in FIG. 3E.

Next, as shown in FIG. 3F, a silicon crystal is selectively grown, for example, by the MOCVD epitaxial method using a single crystal silicon surface in the bottom of the hole 2a as nuclei. At this time, for an n-channel transistor, boron is introduced as a p-type impurity, and for a p-channel transistor, phosphorus is introduced as an n-type impurity. The semiconductor layer (channel region) 12 of the MOS transistor is thus formed.

Figure 3G:
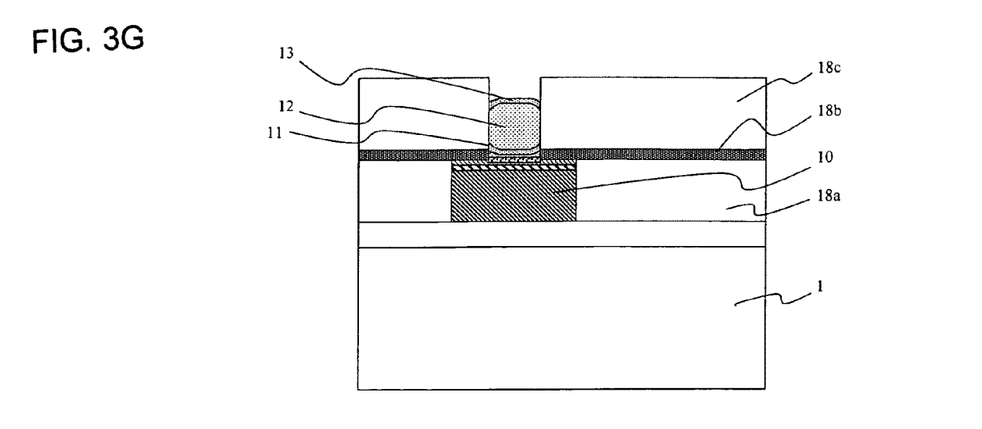
FIG. 3G is a sectional view illustrating a fabrication step following the step illustrated in FIG. 3F.

Next, as shown in FIG. 3G, the upper diffusion layer 13 is formed in the upper surface layer part of the semiconductor layer 12 as follows. For an n-channel transistor, arsenic or phosphorus is ion-implanted as an n-type impurity, and for a p-channel transistor, boron is ion implanted as a p-type impurity; and then, heat treatment is performed.

Figure 3H:
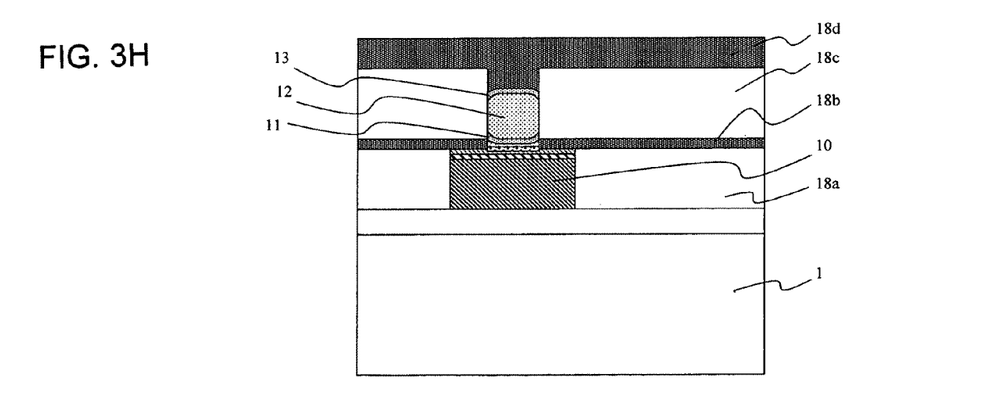
FIG. 3H is a sectional view illustrating a fabrication step following the step illustrated in FIG. 3G.
Figure 3I:
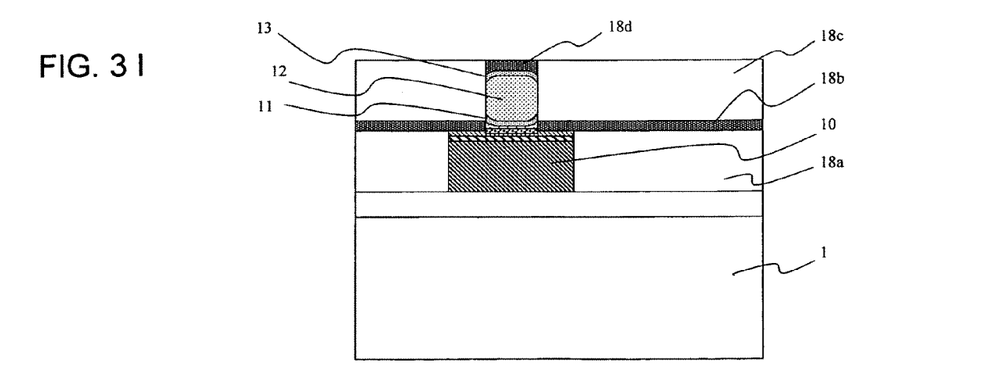
FIG. 3I is a sectional view illustrating a fabrication step following the step illustrated in FIG. 3H.

Next, as shown in FIG. 3H, a silicon nitride film 18d is formed so as to completely bury the hole 2a. Next, as shown in FIG. 3I, the silicon nitride film on the surface outside the hole is removed, for example, by the CMP method such that the silicon nitride film 18d remains only inside the hole.

Figure 3J:
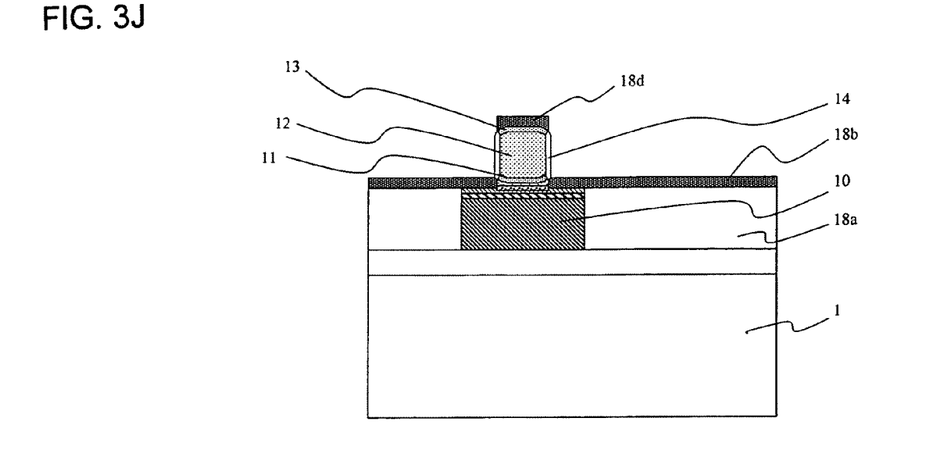
FIG. 3J is a sectional view illustrating a fabrication step following the step illustrated in FIG. 3I.

Next, as shown in FIG. 3J, the silicon oxide film 18c is removed, for example, by wet etching using hydrofluoric acid solution. Next, the gate oxide film 14 is formed on the side surface of the semiconductor pillar including the semiconductor layer 12, for example, by thermal oxidation method.

Figure 3K:
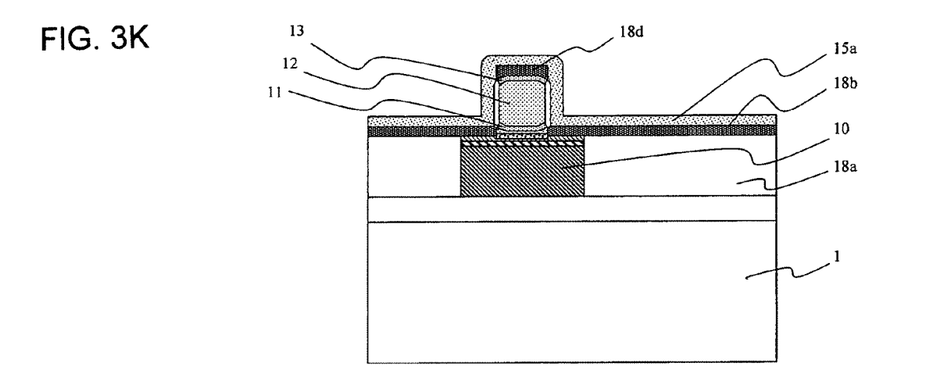
FIG. 3K is a sectional view illustrating a fabrication step following the step illustrated in FIG. 3J.
Figure 3L:
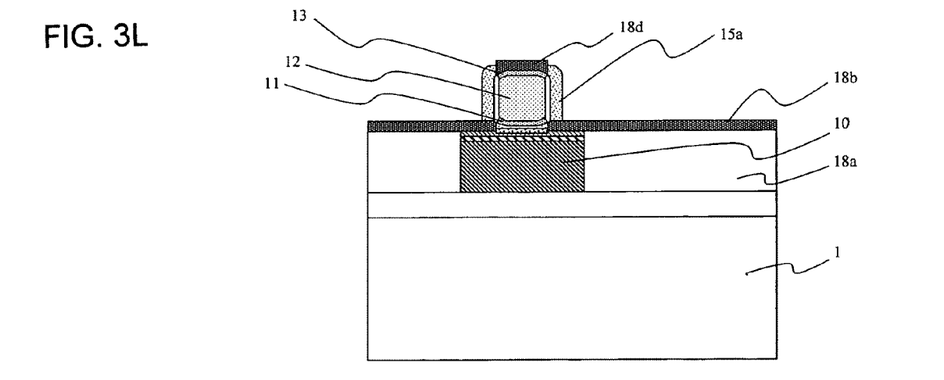
FIG. 3L is a sectional view illustrating a fabrication step following the step illustrated in FIG. 3K.

Next, as shown in FIG. 3K, the impurity containing polysilicon film 15a is formed, for example, by the CVD method. Then, as shown in FIG. 3L, etch back is performed to remove the polysilicon film 15a such that the polysilicon film remains on the side surface of the semiconductor pillar. As a result, a polysilicon side wall made of the polysilicon film 15a remaining on the side surface of the semiconductor pillar is formed.

The side wall is later used as part of the gate electrode. The use of the side wall can increase the controllability of the threshold (Vth) and can maintain the reliability of the gate oxide film.

Figure 3M:
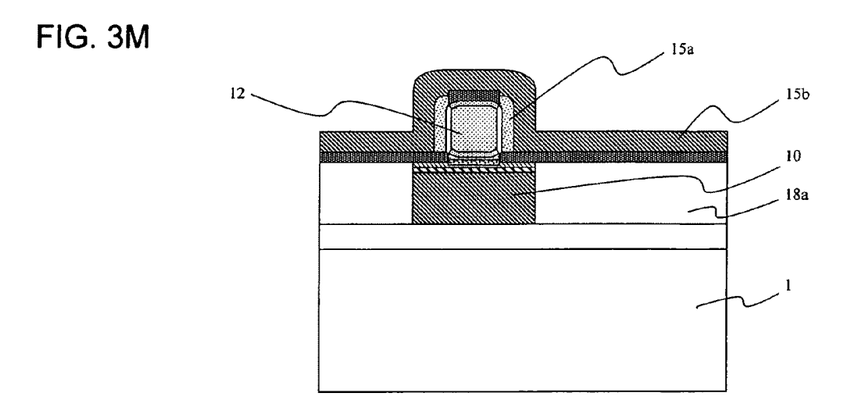
FIG. 3M is a sectional view illustrating a fabrication step following the step illustrated in FIG. 3L.
Figure 3N:
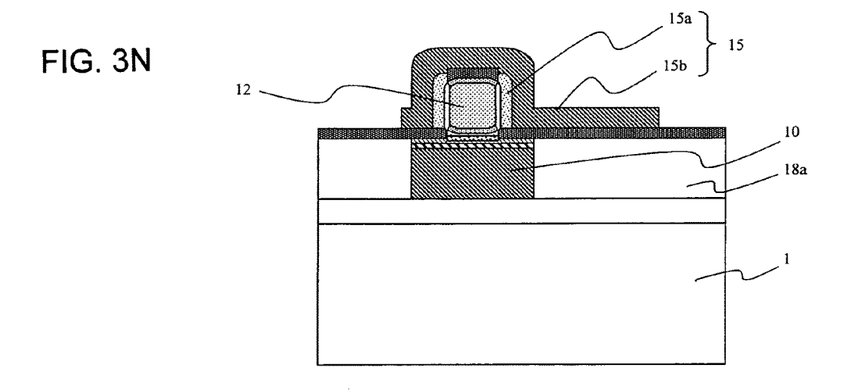
FIG. 3N is a sectional view illustrating a fabrication step following the step illustrated in FIG. 3M.

Next, as shown in FIG. 3M, the tungsten film 15b is deposited, for example, by the CVD method. Then, as shown in FIG. 3N, the gate electrode 15 made of the tungsten film 15b and the polysilicon side wall 15a is formed by patterning the tungsten film 15b using the lithographic technique and the etching technique. In order to suppress the reaction between the tungsten film 15b and the polysilicon side wall 15a, a tungsten nitride film may be provided therebetween.

Figure 3O:
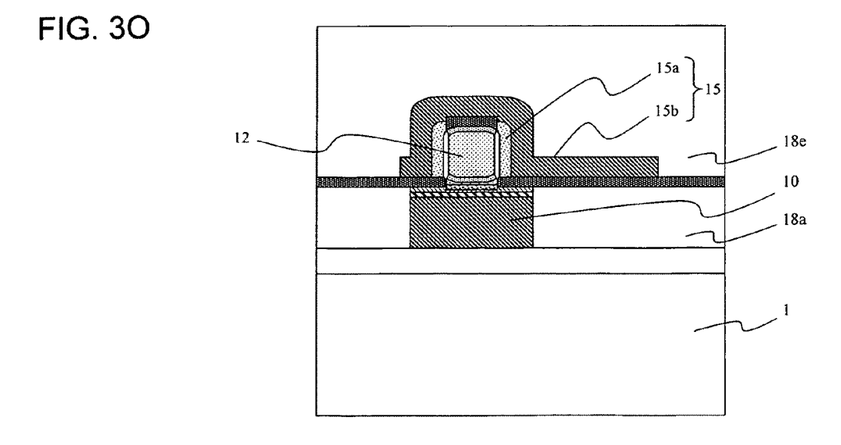
FIG. 3O is a sectional view illustrating a fabrication step following the step illustrated in FIG. 3N.

Next, as shown in FIG. 3O, a silicon oxide film 18e is formed, for example, by the CVD method so as to bury the gate electrode 15.

Figure 3P:
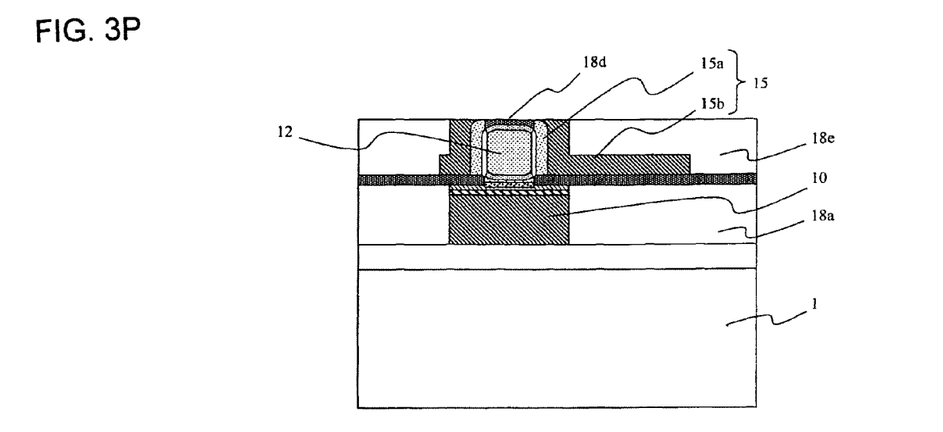
FIG. 3P is a sectional view illustrating a fabrication step following the step illustrated in FIG. 3O.

Next, as shown in FIG. 3P, polishing by the CMP method is performed for planarization until the gate electrode 15 above the upper diffusion layer 13 is removed and the silicon nitride film 18d is exposed.

Figure 3Q:
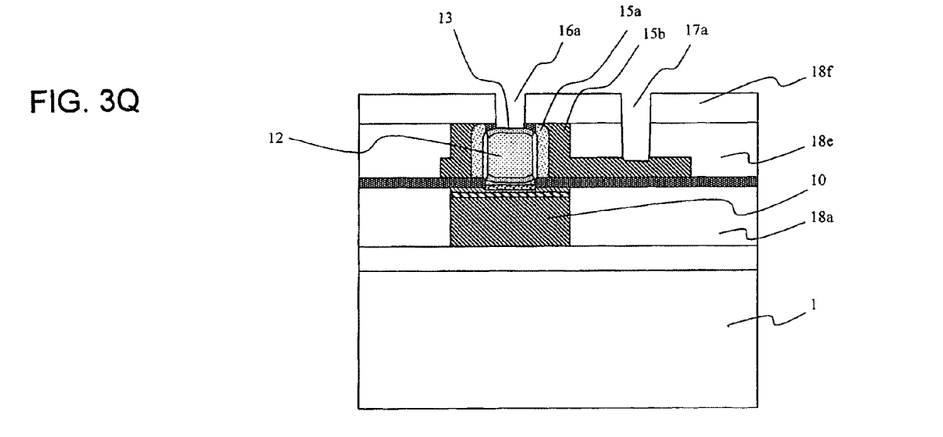
FIG. 3Q is a sectional view illustrating a fabrication step following the step illustrated in FIG. 3P.

Next, a silicon oxide film 18f is formed on the silicon oxide film 18e, for example, by the CVD method so as to cover the exposed gate electrode 15 and the silicon nitride film 18d. Next, as shown in FIG. 3Q, a contact hole 16a reaching the upper diffusion layer 13 and a contact hole 17a reaching the gate electrode are formed by the lithographic technique and the dry etching technique. The silicon nitride film 18d can be used as the etching stopper for forming the contact hole 16a.

Figure 3R:
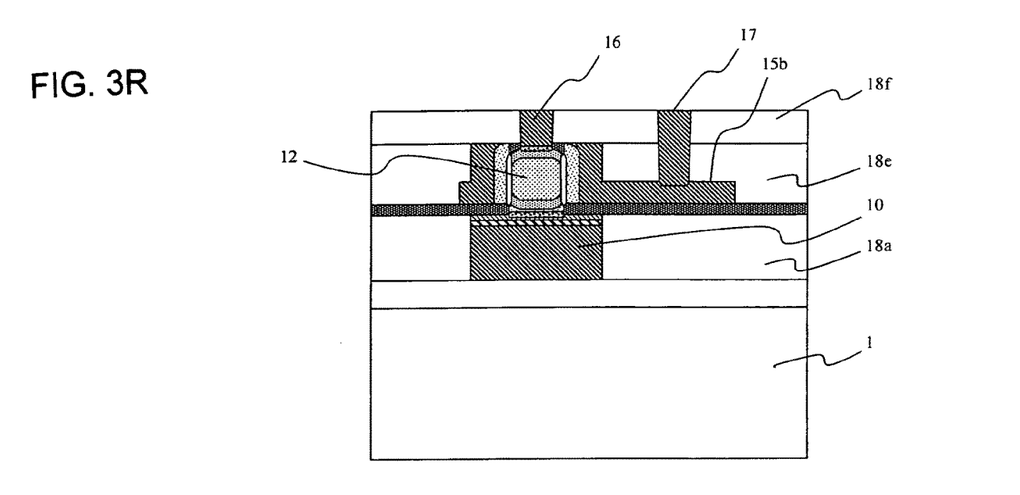
FIG. 3R is a sectional view illustrating a fabrication step following the step illustrated in FIG. 3Q.
Figure 3S:
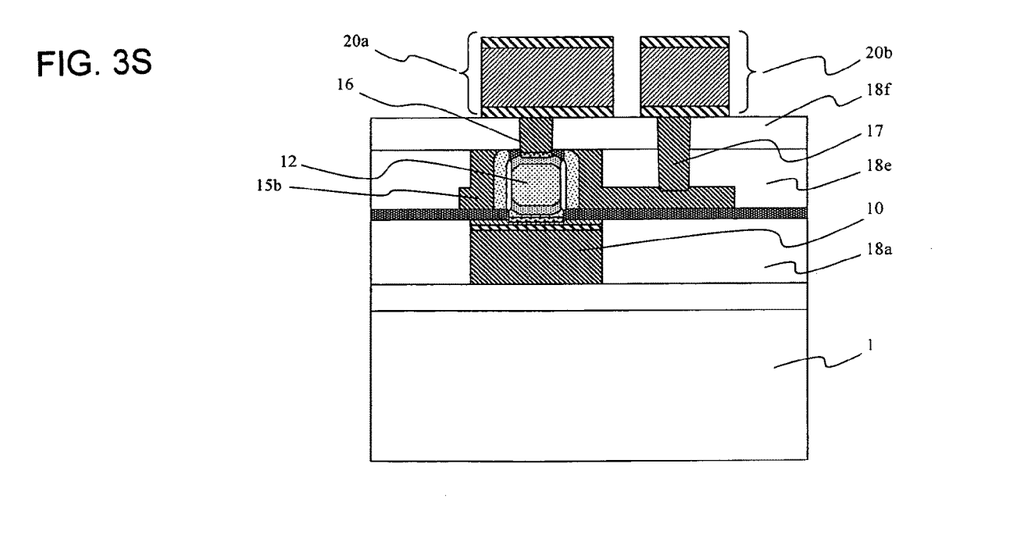
FIG. 3S is a sectional view illustrating a fabrication step following the step illustrated in FIG. 3R.

Next, for example, a titanium film and a titanium nitride film are formed in that order on the surface including the inside of the holes, and then, a tungsten film is formed so as to bury the holes. Then, the conductive films on the surface outside the hole are removed by the CMP method. By doing so, as shown in FIG. 3R, the contact plug 16 connected to the upper diffusion layer 13 and the contact plug 17 connected to the gate electrode 15 are formed.

Next, as shown in FIG. 3S, a laminate film made of a titanium nitride film, an aluminum film and a titanium nitride film is formed, for example, by sputtering technique. Then, the wiring layers 20a and 20b are formed by patterning using the lithographic technique and the dry etching technique.

The above process forms a vertical MOS transistor in an interlayer film between the lower side wiring layer 10 and the upper side wiring layers 20a and 20b.

According to the present exemplary embodiment, another wiring layer is formed instead of the wiring layers 20a and 20b by the same method as the method of forming the wiring layer 10; another vertical MOS transistor is formed on the upper layer portion thereof by the same method as the method of forming the above described vertical MOS transistor; and thereby a structure having a plurality of transistors formed in upper and lower different layers can be formed as shown in FIG. 1. Further, though not illustrated, repeating the same process can produce a structure having a three or more insulating layers between wiring layers, each of the insulating layers including a vertical MOS transistor.

According to the present exemplary embodiment, the foregoing description has been given to an example in which a semiconductor single crystal substrate is not used, but the semiconductor single crystal substrate may be used to form a general planar MOS transistor on the substrate and to form the above described vertical MOS transistor on the upper side of the planar MOS transistor.

It is apparent that the present invention is not limited to the above embodiments, but may be modified and changed without departing from the scope and spirit of the invention.

What is claimed is:

1. A method of fabricating a semiconductor device comprising:
   forming a first insulating layer on a substrate such that a conductive wiring layer is buried in the first insulating layer;
   forming a sacrificial layer on the first insulating layer;
   forming a hole reaching the conductive wiring layer in the sacrificial layer;
   forming a polysilicon film on a surface containing the inside of the hole;
   forming a mask film such that the hole is filled with the mask film;
   removing the mask film such that a part of the mask film remains in a bottom of the hole;
   removing the polysilicon film using the remaining part of the mask film as a mask to leave a part of the polysilicon film on the hole bottom;
   forming a first single crystal silicon layer by single crystallizing at least an upper portion of the remaining polysilicon film part after the remaining mask film part is removed;
   forming a lower diffusion layer by injecting an impurity into the first single crystal silicon layer;
   forming a second single crystal silicon layer on the lower diffusion layer inside the hole;
   forming an upper diffusion layer by injecting an impurity into a surface layer portion of the second single crystal silicon layer;
   exposing a semiconductor pillar including the lower diffusion layer formed inside the hole, the second single crystal silicon layer on the lower diffusion layer, and the upper diffusion layer on the second single crystal silicon layer by entirely removing the sacrificial layer;
   forming a gate insulating film on the peripheral side surface of the pillar;
   forming a gate electrode on the gate insulating film; and
   forming a second insulating layer on the gate electrode and the semiconductor pillar.

2. The method of fabricating a semiconductor device according to claim 1, further comprising forming a etching protection film on the first insulating layer before forming the sacrificial layer,
   wherein the sacrificial layer is removed by etching using the etching protection film for protecting the first insulating layer.

3. The method of fabricating a semiconductor device according to claim 1, further comprising injecting a conductive type impurity opposite to a conductive type of the impurity of the lower diffusion layer into the second single crystal silicon layer,
   wherein the upper diffusion layer is formed by injecting the same conductive type impurity as the conductive type of the impurity of the lower diffusion layer.

4. The method of fabricating a semiconductor device according to claim 1, further comprising:
   forming a etching protection film such that the hole is filled with the etching protection film, after forming the upper diffusion layer in the hole;
   removing the etching protection film such that a part of the etching protection film remains in the hole;
   forming an impurity containing polysilicon film over the semiconductor pillar, after forming the gate insulating film;
   forming a side wall covering a peripheral side surface of the semiconductor pillar by performing an etch back using a remaining part of the etching protection film for protecting the semiconductor pillar;
   forming a conductive film on the side wall; and
   forming a conductive film pattern by patterning the conductive film;
   wherein the gate electrode comprises the side wall and the conductive film pattern.

5. The method of fabricating a semiconductor device according to claim 1, wherein the forming the polysilicon film on a surface containing the inside of the hole comprises forming the polysilicon film on a top surface of the sacrificial layer.

6. The method of fabricating a semiconductor device according to claim 1, wherein the removing the mask film comprises removing the mask film such that a part of the mask film remains only in a bottom of the hole.

7. A method of fabricating a semiconductor device comprising:
   forming a conductive wiring layer on a substrate;
   forming a first insulating layer over the substrate;
   removing a part of the first insulating layer to expose a top surface of the conductive wiring layer;
   forming a sacrificial layer on the top surface of the conductive layer;
   forming a hole penetrating the sacrificial layer to expose a part of the top surface of the conductive layer;
   forming a polysilicon film in the hole, the polysilicon film being disposed on the top surface of the conductive layer;
   forming a first single crystal silicon layer on at least an upper portion of the polysilicon film;
   forming a lower diffusion layer by injecting an impurity into the first single crystal silicon layer;
   forming a second single crystal silicon layer on the first single crystal silicon layer inside the hole;
   forming an upper diffusion layer by injecting an impurity into a surface portion of the second single crystal silicon layer;
   entirely removing the sacrificial layer to expose a side surface of the second single crystal silicon layer;
   forming a gate insulating film on the side surface of the second single crystal silicon layer; and
   forming a gate electrode on the gate insulating film.

8. The method of fabricating a semiconductor device according to claim 7, wherein forming the polysilicon film in the hole comprises:
   forming a first conductive film of polysilicon over the substrate, the first conductive film being disposed on an inner surface of the hole;
   forming a mask film such that the hole is filled with the mask film;
   removing the mask film such that a part of the mask film remains in a bottom of the hole; and
   removing the first conductive film by using the remaining part of the mask film as a mask to dispose the polysilicon film in the hole.

9. The method of fabricating a semiconductor device according to claim 7, wherein forming the first single crystal silicon layer is performed by laser annealing method.

10. The method of fabricating a semiconductor device according to claim 7, wherein forming the second single crystal silicon layer is performed by MOCVD epitaxial method using the first single crystal silicon layer as nuclei.

11. The method of fabricating a semiconductor device according to claim 7, further comprising forming an etching protection film on the first insulating layer before forming the sacrificial layer, wherein the sacrificial layer is removed by using the etching protection film for protecting the first insulating layer.

12. The method of fabricating a semiconductor device according to claim 11, wherein the etching protection film includes a silicon nitride film, and the sacrificial layer is removed by wet etching using hydrofluoric acid solution.

13. The method of fabricating a semiconductor device according to claim 7, wherein forming the gate electrode comprises:
   forming a second conductive film of polysilicon over the substrate, the second conductive film being disposed on the gate insulating film; and
   forming a side wall of the second conductive film around the side surface of the second single crystal silicon layer by dry etching the second conductive film.

14. The method of fabricating a semiconductor device according to claim 13, further comprising forming a metal film on the second conductive film, wherein the metal film extends to a first direction over the substrate, and both the metal film and the second conductive film operate as the gate electrode.

15. The method of fabricating a semiconductor device according to claim 7, wherein a material of the substrate comprises quartz.

16. The method of fabricating a semiconductor device according to claim 7, wherein the forming the polysilicon film in the hole comprises forming the polysilicon film on a top surface of the sacrificial layer.

\* \* \* \* \*